US012223990B2

(12) United States Patent
Wang et al.

(10) Patent No.: US 12,223,990 B2
(45) Date of Patent: Feb. 11, 2025

(54) STORAGE CELL AND DATA READ/WRITE METHOD AND STORAGE ARRAY THEREOF

(71) Applicant: CHANGXIN MEMORY TECHNOLOGIES, INC., Hefei (CN)

(72) Inventors: Xiaoguang Wang, Hefei (CN); Er-Xuan Ping, Hefei (CN); Baolei Wu, Hefei (CN); Yulei Wu, Hefei (CN)

(73) Assignee: CHANGXIN MEMORY TECHNOLOGIES INC., Hefei (CN)

( * ) Notice: Subject to any disclaimer, the term of this patent is extended or adjusted under 35 U.S.C. 154(b) by 553 days.

(21) Appl. No.: 17/595,459

(22) PCT Filed: Nov. 11, 2020

(86) PCT No.: PCT/CN2020/128137
§ 371 (c)(1),
(2) Date: Nov. 17, 2021

(87) PCT Pub. No.: WO2021/253716
PCT Pub. Date: Dec. 23, 2021

(65) Prior Publication Data
US 2022/0358981 A1  Nov. 10, 2022

(30) Foreign Application Priority Data

Jun. 19, 2020 (CN) .......................... 202010568196.X
Jun. 19, 2020 (CN) .......................... 202021152513.1

(51) Int. Cl.
*G11C 11/16* (2006.01)
*H10B 61/00* (2023.01)

(52) U.S. Cl.
CPC ...... *G11C 11/1659* (2013.01); *G11C 11/1655* (2013.01); *G11C 11/1657* (2013.01); *H10B 61/22* (2023.02)

(58) Field of Classification Search
CPC ... G11C 8/16; G11C 11/1653; G11C 11/1655; G11C 11/1657; G11C 11/1659;
(Continued)

(56) References Cited

U.S. PATENT DOCUMENTS 7,301,799 B2   11/2007   Schloesser
8,902,644 B2   12/2014   Sakimura
(Continued)

FOREIGN PATENT DOCUMENTS

CN   1448943 A   10/2003
CN   1524269 A   8/2004
(Continued)

OTHER PUBLICATIONS

Supplementary European Search Report cited in EP20941091.9, mailed on Nov. 11, 2022, 9 pages.
(Continued)

*Primary Examiner* — Fazli Erdem
(74) *Attorney, Agent, or Firm* — Kilpatrick Townsend & Stockton LLP

(57) ABSTRACT

Embodiments of the present invention provide a storage cell and a data read/write method and storage array thereof. The storage cell includes a bit line, a tunnel junction, and four access transistors. Each access transistor includes at least an active region. The active region includes a source. The sources of the access transistors are all electrically connected to a first end of the tunnel junction. A second end of the tunnel junction is electrically connected to the bit line, and the bit line extends along a first direction. The active regions of the access transistors are isolated from one another. Long-side extension directions of the active regions of the access transistors are the same, and a first angle θ is (Continued)

formed between the long-side extension directions of the active regions and the first direction; wherein θ is a non-right angle.

18 Claims, 6 Drawing Sheets

(58) Field of Classification Search
CPC . G11C 11/1673; G11C 11/1675; H10B 61/22; H10N 50/10
USPC .......................................................... 257/421
See application file for complete search history.

(56) References Cited

U.S. PATENT DOCUMENTS

| | | |
|---|---|---|
| 2004/0100835 A1 | 5/2004 | Sugibayashi et al. |
| 2007/0296007 A1 | 12/2007 | Park |
| 2009/0250735 A1* | 10/2009 | Asao ..................... H10B 63/00 257/295 |
| 2010/0238707 A1 | 9/2010 | Tsuchida |
| 2010/0238711 A1 | 9/2010 | Asao |
| 2012/0281461 A1 | 11/2012 | Asao |
| 2012/0286339 A1 | 11/2012 | Asao |
| 2013/0182501 A1* | 7/2013 | Sakimura ............... H10B 61/22 365/158 |
| 2015/0035097 A1* | 2/2015 | Asao ...................... H10B 61/00 257/421 |
| 2015/0263068 A1 | 9/2015 | Ito |

FOREIGN PATENT DOCUMENTS

| | | |
|---|---|---|
| CN | 100407410 C | 7/2008 |
| CN | 101471131 A | 7/2009 |
| CN | 106158000 A | 11/2016 |
| CN | 212391999 U | 1/2021 |

OTHER PUBLICATIONS

Written Opinion cited in PCT/CN2020/128137, mailed on Mar. 18, 2021, 6 pages.
International Search Report as cited in PCT Application No. PCT/CN2020/128137 mailed Mar. 18, 2021, 5 pages.
State Intellectual Property Office of the People's Republic of China, Office Action and Search Report Issued in Application No. 202010568196.X, Aug. 13, 2024, 7 pages.

* cited by examiner

STORAGE CELL AND DATA READ/WRITE METHOD AND STORAGE ARRAY THEREOF

CROSS-REFERENCE TO RELATED APPLICATION

This application claims priority to and benefits of Chinese Patent Application No. 202010568196.X, entitled "STORAGE CELL AND DATA READ/WRITE METHOD AND STORAGE ARRAY THEREOF", filed on Jun. 19, 2020, and Chinese Patent Application No. 202021152513.1, entitled "STORAGE CELL AND DATA READ/WRITE METHOD AND STORAGE ARRAY THEREOF", filed on Jun. 19, 2020, the entire content of which is incorporated herein by reference.

FILED OF THE INVENTION

Embodiments of the present invention relate to the field of memory technologies, in particular to a storage cell and a data read/write method and storage array thereof.

BACKGROUND OF THE INVENTION

A non-volatile magnetic random access memory (MRAM) is a random access memory which stores data according to resistive properties of memory. It uses different memory resistance values caused by different magnetization directions to record data. However, with the development of science and technology and the gradual increase of storage density, how to further improve the comprehensive performance and the integration of the MRAM under the condition of ensuring the writing (or programming) driving capability of the MRAM has become an urgent technical problem to be solved at present.

SUMMARY OF THE INVENTION

With respect to the above existing problems, embodiments of the present invention provide a storage cell and a data read/write method and storage array thereof, so as to reduce the size of the storage cell and improve the integration of the storage array including the storage cell.

In a first aspect, the embodiments of the present invention provide a storage cell, including: a bit line, a tunnel junction, and four access transistors;
  sources of the access transistors being all electrically connected to a first end of the tunnel junction; a second end of the tunnel junction being electrically connected to the bit line; and the bit line extending along a first direction; and
  active regions corresponding to the access transistors being isolated from each other; long-side extension directions of the active regions corresponding to the access transistors being the same, and a first angle $\theta$ being formed between the long-side extension directions of the active regions and the first direction; wherein $\theta$ is a non-right angle.

In a second aspect, the embodiments of the present invention further provide a data read/write method of a storage cell, wherein the active region of each access transistor of the storage cell further includes a drain and a channel region, and the source and the drain are located on two opposite sides of the channel region respectively; and each access transistor further includes a gate;
  the data read/write method includes a data write phase;
  the second end of the tunnel junction receives a high-level signal transmitted by the bit line, the drain of the access transistor receives a low-level signal, and the gate of each access transistor receives a gate control signal to control the source and the drain of each access transistor to connect, to perform a first write operation;
  and/or the second end of the tunnel junction receives a low-level signal transmitted by the bit line, the drain of the access transistor receives a high-level signal, and the gate of each access transistor receives a gate control signal to control the source and the drain of each access transistor to connect, to perform a second write operation.

In a third aspect, the embodiments of the present invention further provide a storage array, including: a plurality of the above-mentioned storage cells; tunnel junctions of the storage cells being arranged in an array;
  wherein the first direction is a column direction of the tunnel junctions of the storage cells, and the second direction is a row direction of the tunnel junctions of the storage cells.

According to the storage cell and the data read/write method and storage array thereof provided in the embodiments of the present invention, the long-side extension directions of the active regions of the access transistors in the storage cell are configured to be at a first angle $\theta$ with the extension direction of the bit line, and $\theta$ is a non-right angle, that is, the active regions of the access transistors are inclined, which enables the access transistors to be densely arranged and is conducive to reducing the size of the storage cell, so that the integration of the storage array can be improved when the storage cell is applied to the storage array.

DETAILED DESCRIPTION OF THE EMBODIMENTS

Figure 1:
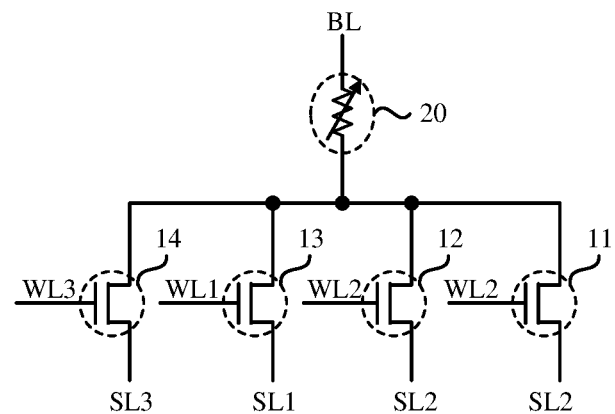
FIG. 1 is a schematic structural diagram of an equivalent circuit of a storage cell according to an embodiment of the present invention.

The present invention is described in further detail below with reference to the accompanying drawings and embodiments. It may be understood that specific embodiments described herein are intended only to interpret the present invention and not to limit the present invention. In addition, it should be further noted that, to facilitate description, only some of rather than all of the structures relevant to the present invention are shown in the drawings.

Figure 2:
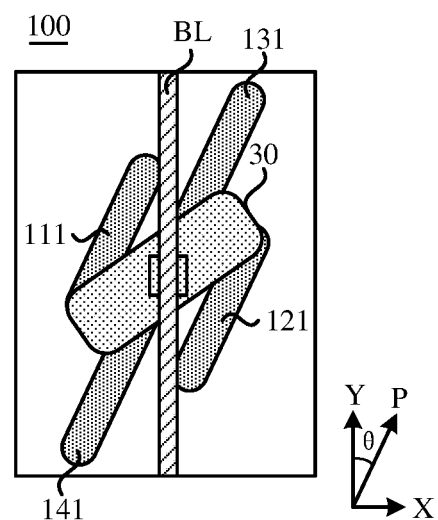
FIG. 2 is a schematic top view of a storage cell according to an embodiment of the present invention.

An embodiment of the present invention provides a storage cell that is a non-volatile magnetic storage cell and can be arranged in an MRAM. FIG. 1 is a schematic structural diagram of an equivalent circuit of a storage cell according to an embodiment of the present invention, and FIG. 2 is a schematic top view of a storage cell according to an embodiment of the present invention. Referring to FIG. 1 and FIG. 2, a storage cell 100 includes a bit line BL, a tunnel junction 20, and four access transistors (11, 12, 13, 14). The storage cell 100 further includes active regions (111, 121, 131, 141), that is, the access transistor 11 is located in the active region 111, the access transistor 12 is located in the active region 121, the access transistor 13 is located in the active region 131, and the access transistor 14 is located in the active region 141. Sources of the access transistors (11, 12, 13, 14) are all electrically connected to a first end of the tunnel junction 20; and a second end of the tunnel junction 20 is electrically connected to the bit line BL. In this way, a magnetization direction of a free layer in the tunnel junction 20 can be controlled to change by inputting corresponding electrical signals to the two ends of the tunnel junction 20 respectively, so that data signals can be written into the storage cell. Alternatively, data stored in the storage cell 100 is read by inputting corresponding electrical signals to the second end of the tunnel junction 20 and controlling the access transistors (11, 12, 13, 14) to switch on. At the same time, since the storage cell 100 includes four access transistors (11, 12, 13, 14) and the sources of the access transistors (11, 12, 13, 14) are all electrically connected to the first end of the tunnel junction 20, the four access transistors (11, 12, 13, 14) can be controlled to switch on simultaneously when the data signals are written, so that the four access transistors (11, 12, 13, 14) all can transmit electrical signals to the first end of the tunnel junction 20, to enable the first end of the tunnel junction 20 to receive strong electrical signals, which increases the driving (writing or programming) capability and is conducive to the storage of the data signals. The access transistors (11, 12, 13, 14) each may further include a gate.

Still referring to FIG. 1 and FIG. 2, the bit line BL of the storage cell 100 extends along a first direction Y. In this case, the active regions (111, 121, 131, 141) corresponding to the access transistors (11, 12, 13, 14) are isolated from one another, that is, the active region 111 corresponding to the access transistor 11, the active region 121 corresponding to the access transistor 12, the active region 131 corresponding to the access transistor 13, and the active region 141 corresponding to the access transistor 14 are isolated from one another. At the same time, long-side extension directions of the active region 111 corresponding to the access transistor 11, the active region 121 corresponding to the access transistor 12, the active region 131 corresponding to the access transistor 13, and the active region 141 corresponding to the access transistor 14 are the same, and a first angle θ is formed between the long-side extension directions P of the active region 111 corresponding to the access transistor 11, the active region 121 corresponding to the access transistor 12, the active region 131 corresponding to the access transistor 13, the active region 141 corresponding to the access transistor 14 and the first direction Y; wherein θ≠n(π/2), and n is a natural number, that is, θ is a non-right angle. In this way, the first angle θ between the long-side extension directions of the active regions of the access transistor and the extension direction of the bit line is set to an integer multiple of non-90°, so that the tunnel junction and the four access transistors are closely arranged, so as to reduce the size of the storage cell, which is conducive to improving the integration of the storage cell in the storage array.

Illustratively, still referring to FIG. 1 and FIG. 2, when the four access transistors are the first access transistor 11, the second access transistor 12, the third access transistor 13, and the fourth access transistor 14 respectively, a long side of the active region 111 of the first access transistor 11 is disposed opposite to a long side of the active region 121 of the second access transistor 12, and the active region 131 of the third access transistor 13 and the active region 141 of the fourth access transistor 14 are located between the active region 111 of the first access transistor 11 and the active region 121 of the second access transistor 12; and a short side of the active region 131 of the third access transistor 13 is disposed opposite to a short side of the active region 141 of the fourth access transistor 14.

Optionally, still referring to FIG. 1 and FIG. 2, when the four access transistors are the first access transistor 11, the second access transistor 12, the third access transistor 13, and the fourth access transistor 14 respectively, an orthographic projection of the tunnel junction 20 in a film layer where the active region of each access transistor is located covers at least a partial region between the active region 111 of the first access transistor 11 and the active region 121 of the second access transistor 12, and covers at least a partial region between the active region 131 of the third access transistor 13 and the active region 141 of the fourth access transistor 14, thus facilitating electrical connections between the access transistors (11, 12, 13, 14) and the first end of the tunnel junction.

Optionally, still referring to FIG. 1 and FIG. 2, the storage cell 100 may also be provided with a connection structure 30. An orthographic projection of the connection structure 30 in the active region of each access transistor overlaps with the active regions of the four access transistors; and the sources of the access transistors are all electrically connected to the first end of the tunnel junction 20 through the connection structure 30.

Specifically, when the four access transistors are the first access transistor 11, the second access transistor 12, the third access transistor 13, and the fourth access transistor 14 respectively, an orthographic projection of the connection structure 30 in the active region of each access transistor overlaps with the active region of the first access transistor 11, the active region of the second access transistor 12, the active region of the third access transistor 13, and the active region of the fourth access transistor 14. In this case, through an electrical contact structure such as a plug, one side of the connection structure 30 may be electrically connected to the source of the first access transistor 11, the source of the second access transistor 12, the source of the third access transistor 13, and the source of the fourth access transistor 14 respectively, and the other side of the connection structure 30 may be directly or indirectly electrically connected to the first end of the tunnel junction 20. In this way, the source of the first access transistor 11, the source of the second access transistor 12, the source of the third access transistor 13, and the source of the fourth access transistor 14 can be all electrically connected to the first end of the tunnel junction 20 through the connection structure 30, thus simplifying the design, reducing the cost, and improving a product yield.

Optionally, the storage cell further includes at least one word line and at least one source line; the word line extending along a second direction; wherein the first direction intersects with the second direction. In this case, each access transistor further includes a channel region and a drain, and the source and the drain are located on two opposite sides of the channel region respectively; gates of the access transistors are electrically connected to the word line; and the drains of the access transistors are electrically connected to the source line.

In the present specific embodiment, in each access transistor, what is electrically connected to the tunnel junction 20 through the connection structure 30 is called as a source and what is electrically connected to the source line is called as a drain. This is intended only to make it easy to distinguish two electrodes in the access transistor, so as to more clearly describe the structure of the storage cell provided in the present specific embodiment, and does not thereby limit the protection scope. Those skilled in the art may also, according to an actual requirement, to call, in each access transistor, what is electrically connected to the tunnel junction 20 through the connection structure 30 as a drain and correspondingly call what is electrically connected to the source line as a source.

Figure 3:
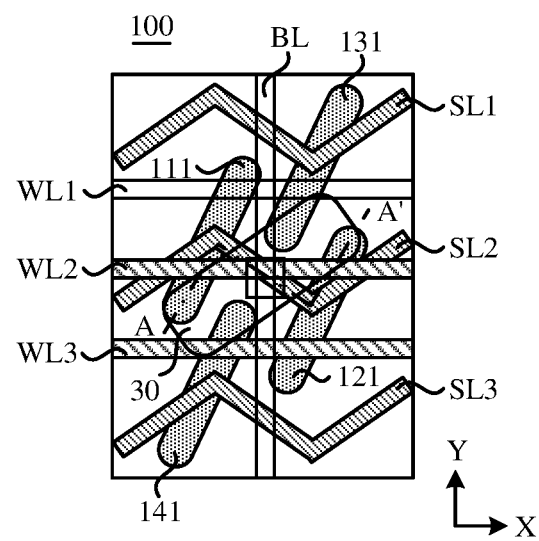
FIG. 3 is a schematic top view of another storage cell according to an embodiment of the present invention.

Illustratively, FIG. 3 is a schematic top view of another storage cell according to an embodiment of the present invention. Referring to FIG. 1 and FIG. 3, the four access transistors of the storage cell 100 are the first access transistor 11, the second access transistor 12, the third access transistor 13, and the fourth access transistor 14 respectively. The at least one word line of the storage cell 100 may include a first word line WL1, a second word line WL2, and a third word line WL3, and the first word line WL1, the second word line WL2, and the third word line WL3 are sequentially arranged along the first direction, that is, the first word line WL1, the second word line WL2, and the third word line WL3 are arranged along the extension direction of the bit line BL. The gate of the third access transistor 13 is electrically connected to the first word line WL1; the gate of the first access transistor 11 and the gate of the second access transistor 12 are both electrically connected to the second word line WL2; and the gate of the fourth access transistor 14 is electrically connected to the third word line WL3.

In this case, an orthographic projection of the first word line WL1 in the active region of each access transistor overlaps with the active region 111 of the first access transistor 11 and the active region 131 of the third access transistor 13; an orthographic projection of the second word line WL2 in the active region of each access transistor overlaps with the active region 111 of the first access transistor 11 and the active region 121 of the second access transistor 12; and an orthographic projection of the third word line WL3 in the active region of each access transistor overlaps with the active region 141 of the fourth access transistor 14 and the active region 121 of the second access transistor 12.

In this way, a gate control signal transmitted by the first word line WL1 can control the source and the drain of the third access transistor 13 to connect, a gate control signal transmitted by the second word line WL2 can control the source and the drain of the first access transistor 11 to connect and the source and the drain of the second access transistor 12 to connect, and a gate control signal transmitted by the third word line WL3 can control the source and the drain of the fourth access transistor 14 to connect, so that data signals can be transmitted to the first end of the tunnel junction 20 through the ON access transistors, or data signals stored in the tunnel junction 20 can be output through the ON access transistors Channel doping types of the four access transistors may be the same, so that the first word line WL1, the second word line WL2, and the third word line WL3 transmit the same gate control signal, enabling the sources and the drains of the first access transistor 11, the second access transistor 12, the third access transistor 13, and the fourth access transistor 14 to be simultaneous controlled to switch on. At the same time, the bit line BL and the word lines (WL1, WL2, WL3) may be straight lines, the bit line BL may extend along the first direction Y, and the word lines (WL1, WL2, WL3) may extend a second direction X perpendicular to the first direction Y.

Correspondingly, the at least one source line of the storage cell 100 may include a first source line SL1, a second source line SL2, and a third source line SL3, the first source line SL1, the second source line SL2, and the third source line SL3 extend in the same direction, the first source line SL1, the second source line SL2, and the third source line SL3 are sequentially arranged along the first direction Y, that is, the first source line SL1, the second source line SL2, and the third source line SL3 are arranged in the same direction as the first word line WL1, the second word line WL2, and the third word line WL3. When the source of the access transistor in the storage cell 100 is the source of the access transistor and the drain of the access transistor is the drain of the access transistor, the drain of the third access transistor 13 may be electrically connected to the first source line SL1, and the drain of the first access transistor 11 and the drain of the second access transistor 12 may be both electrically connected to the second source line SL2; and the drain of the fourth access transistor 14 may be electrically connected to the third source line SL3.

In this case, an orthographic projection of the first source line SL1 in the active region of each access transistor overlaps with the drain of the third access transistor 13; an orthographic projection of the second source line SL2 in the active region of each access transistor overlaps with both the drain of the first access transistor 11 and the drain of the second access transistor 12; and an orthographic projection of the second source line SL2 in a film layer where the active region of each access transistor is located further overlaps with an orthographic projection of the tunnel junction 20 in the film layer where the active region of each access transistor is located; and an orthographic projection of the third source line SL3 in the active region of each access transistor overlaps with the drain of the fourth access transistor 14.

In this way, when the source and the drain of the third access transistor 13 are controlled to be on, a data signal transmitted by the first source line SL1 can be transmitted to the first end of the tunnel junction 20 sequentially through the source and the drain of the third access transistor 13, or a data signal stored in the tunnel junction 20 can be output sequentially through the source and the drain of the third access transistor 13 and the first source line SL1. When the source and the drain of the first access transistor 11 are controlled to be on, a data signal transmitted by the second source line SL2 can be transmitted to the first end of the tunnel junction 20 sequentially through the source and the drain of the first access transistor 11, or a data signal stored in the tunnel junction 20 can be output sequentially through the source and the drain of the first access transistor 11 and the second source line SL2. When the source and the drain of the second access transistor 12 are controlled to be on, a data signal transmitted by the second source line SL2 can be transmitted to the first end of the tunnel junction 20 sequentially through the source and the drain of the second access transistor 12, or a data signal stored in the tunnel junction 20 can be output sequentially through the source and the drain of the second access transistor 12 and the second source line SL2. When the source and the drain of the fourth access transistor 14 are controlled to be on, a data signal transmitted by the third source line SL3 can be transmitted to the first end of the tunnel junction 20 sequentially through the source and the drain of the fourth access transistor 14, or a data signal stored in the tunnel junction 20 can be output sequentially through the source and the drain of the fourth access transistor 14 and the third source line SL3.

Figure 4:
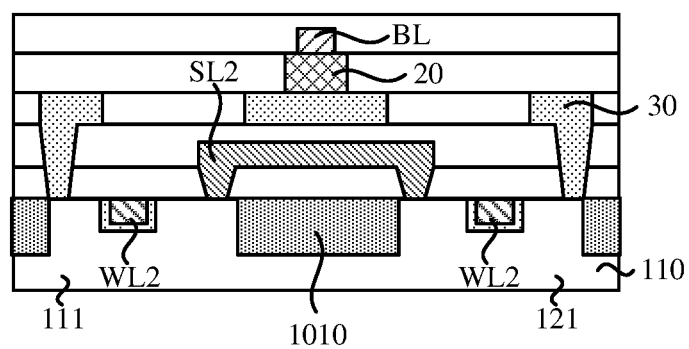
FIG. 4 is a schematic structural diagram of a film layer of a cross section A-A' in FIG. 3.

Optionally, when the storage cell includes an access transistor, a tunnel junction, a bit line, a word line, and a source line, corresponding functional film layer can be formed on a substrate. The substrate may be, for example, a silicon substrate or the like. For example, FIG. 4 is a schematic structural diagram of a film layer of a cross section A-A' in FIG. 3. As shown in FIG. 4, the storage cell 100 may include a substrate 110. The substrate 110 may be, for example, a silicon-based substrate. The active regions of the access transistors are isolated from one another by forming shallow trench isolation (STI) 1010 in a particular region of the substrate 110. It should be noted that, the STI in FIG. 4 is only illustrative, and its actual structure and size may also be set by those skilled in the art according to a requirement. The active regions (111 and 121) of the access transistors are provided with trenches, and part of the word line (WL2) is located in the trenches of the active regions (111 and 121) of the access transistors, so that the word lines in the trenches can serve as gates of the access transistors. In this case, side walls of the trenches may be provided with corresponding insulation materials, that is, gate insulation layers, so that the gates of the access transistor and channel regions of the active regions thereof are isolated from one another. It should be noted that, the gates in the figure are only illustrative, an actual height of the gates in the trenches may be designed differently due to an actual requirement, which is not limited in the present embodiment and is not limited to the form of a buried-gate transistor, and may also be in a non-buried gate form, such as a planar transistor or a vertical-gate transistor. The source line (SL2) is located on one side of the word line (WL2) away from the substrate 110, and the source line (SL2) may be electrically connected to the drain of the access transistor through a corresponding connection through-hole. The connection structure 30 is located on one side of the source line (SL2) away from the substrate 110; in this case, the connection structure 30 may be electrically connected to the source of the access transistor through a corresponding plug or connection through-hole or the like. The tunnel junction 20 is located on one side of the connection structure 30 away from the substrate 110, that is, the first end of the tunnel junction 20 may be in direct contact with the connection structure 30, so as to be electrically connected to the source of each access transistor through the connection structure. FIG. 4 shows a situation where the first end of the tunnel junction 20 is in direct contact with the connection structure 30, but the present embodiments is not limited thereto, and those skilled in the art can set a form of indirect electrical connection according to a requirement. The bit line BL is located on one side of the tunnel junction 20 away from the substrate 110, that is, the bit line BL may be in direct contact with the second end of the tunnel junction 20, to make the bit line BL directly electrically connected to the second end of the tunnel junction 20. Similarly, the bit line BL may also be indirectly electrically connected to the tunnel junction 20, which is not limited in the present embodiment.

An embodiment of the present invention further provides a data read/write method of a storage cell. The data read/write method may be performed by the storage cell provided in the embodiment of the present invention. Therefore, the data read/write method of the storage cell has beneficial effects of the storage cell provided in the embodiment of the present invention. The same content may be obtained with reference to the above description about the storage cell provided in the embodiment of the present invention, and is not described in detail herein.

Figure 5:
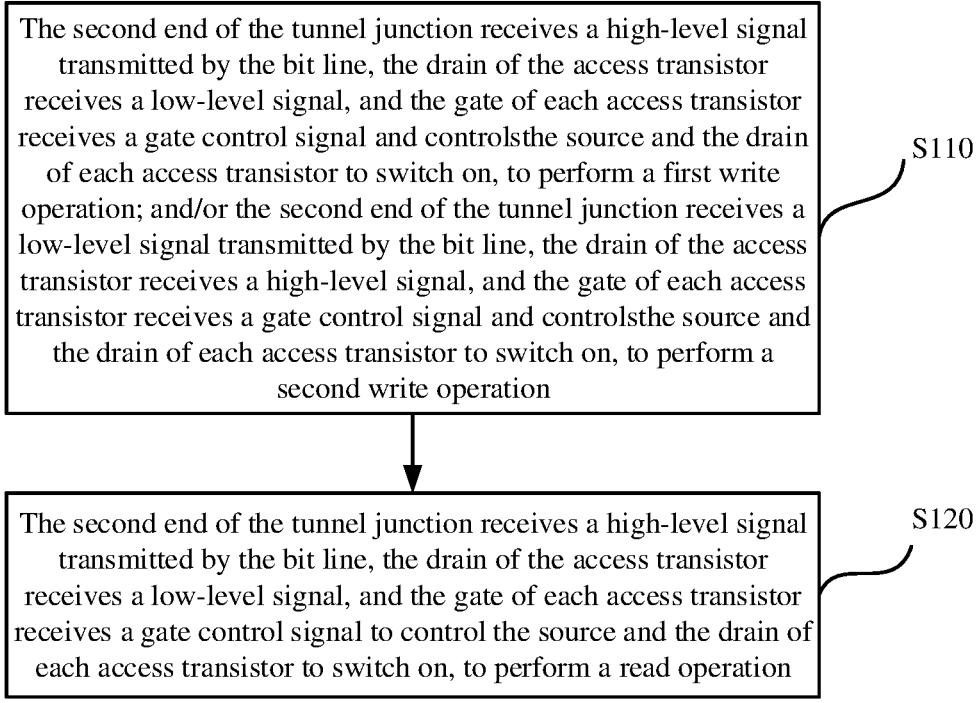
FIG. 5 is a flowchart of a data read/write method of a storage cell according to an embodiment of the present invention.

Correspondingly, the storage cell includes at least a bit line, a tunnel junction, and four access transistors. Each access transistor includes a source, a drain, and a channel region, and the source and the drain are located on two opposite sides of the channel region respectively. Each access transistor further includes a gate. FIG. 5 is a flowchart of a data read/write method of a storage cell according to an embodiment of the present invention. As shown in FIG. 5, the data read/write method of the storage cell includes: a data write phase S110 and a data read phase S120. The data write phase includes a first write operation and/or a second write operation.

In S110, the second end of the tunnel junction receives a high-level signal transmitted by the bit line, the drain of the access transistor receives a low-level signal, and the gate of each access transistor receives a gate control signal and controls the source and the drain of each access transistor to connect, to perform a first write operation; and/or the second end of the tunnel junction receives a low-level signal transmitted by the bit line, the drain of the access transistor receives a high-level signal, and the gate of each access transistor receives a gate control signal and controls the source and the drain of each access transistor to connect, to perform a second write operation.

In S120, the second end of the tunnel junction receives a high-level signal transmitted by the bit line, the drain of the access transistor receives a low-level signal, and the gate of each access transistor receives a gate control signal to control the source and the drain of each access transistor to connect, to perform a read operation.

Figure 6:
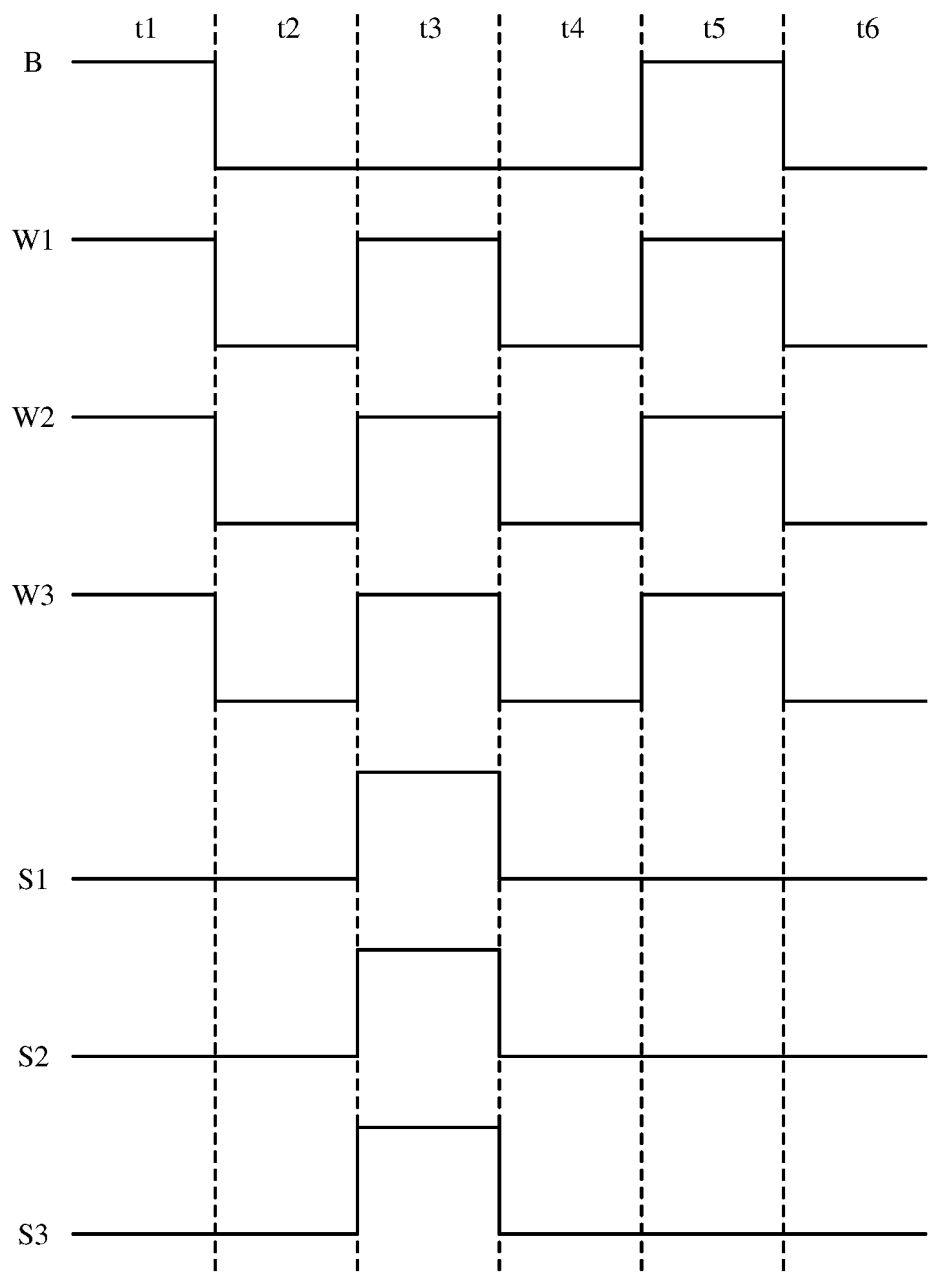
FIG. 6 is a timing diagram of a data read/write method of a storage cell according to an embodiment of the present invention.

Illustratively, taking the storage cell shown in FIG. 1 and FIG. 3 as an example, channel doping type of the four access transistors of the storage cell are the same in this case. For example, the channel doping types of the four access transistors of the storage cell are all N-type. In this case, the access transistors may receive the same gate control signal. FIG. 6 is a timing diagram of a data read/write method of a storage cell according to an embodiment of the present invention. Referring to FIG. 1, FIG. 3, and FIG. 6, the data write phase includes a write phase of data "1" and a write phase of data "0". In the write phase t1 of data "1", high-level gate control signals W1, W2, and W3 transmitted by the word lines WL1, WL2, and WL3 are transmitted to the gates of the access transistors 11, 12, 13, and 14 respectively, to enable the sources and the drains of the access transistors to switch on. In this case, low-level signals S1, S2, and S3 transmitted by the source lines SL1, SL2, and SL3 are transmitted to the first end of the tunnel junction 20 respectively through the sources and the drains of the access transistors 11, 12, 13, and 14. At the same time, the second end of the tunnel junction 20 may receive a high-level read/write signal B transmitted by the bit line BL, so that magnetization directions of a free layer and a fixed layer between the first end and the second end of the tunnel junction 20 are parallel, and the tunnel junction presents a low-resistance state. In the write phase t3 of data "0", high-level gate control signals W1, W2, and W3 transmitted by the word lines WL1, WL2, and WL3 are transmitted to the gates of the access transistors 11, 12, 13, and 14 respectively, to enable the sources and the drains of the access transistors to connect. In this case, high-level signals S1, S2, and S3 transmitted by the source lines SL1, SL2, and SL3 are transmitted to the first end of the tunnel junction 20 respectively through the sources and the drains of the access transistors 11, 12, 13, and 14. At the same time, the second end of the tunnel junction 20 may receive a low-level read/write signal B transmitted by the bit line BL, so that magnetization directions of a free layer and a fixed layer between the first end and the second end of the tunnel junction 20 are antiparallel, and the tunnel junction presents a high-resistance state. Certainly, those skilled in the art should understand that, the present embodiment does not specify that "1" corresponds to the low-resistance state and "0" to the high resistance state, or vice versa.

Correspondingly, in the data read phase t5, high-level gate control signals W1, W2, and W3 transmitted by the word lines WL1, WL2, and WL3 are transmitted to the gates of the access transistors 11, 12, 13, and 14 respectively, to enable the sources and the drains of the access transistors to connect. At the same time, the second end of the tunnel junction 20 may receive a high-level read/write signal B transmitted by the bit line BL, and the source lines (SL1, SL2, SL3) apply low-level signals, causing a current to flow from the second end of the tunnel junction 20 to the first end of the tunnel junction 20. A corresponding storage state can be read by detecting the resistance of the tunnel junction 20.

In addition, in hold phases t2, t4, and t6 of the storage cell, the low-level signals transmitted by the word lines WL1, WL2, and WL3 make the access transistors 11, 12, 13, and 14 in a disconnection state. At the same time, the signal on the bit line BL is also a low-level signal. In this case, neither data write nor data read is performed.

It should be noted that, the terms "high level" and "low level" in the present specific embodiment are relative concepts (that is, a voltage value of the high level is higher than that of the low level corresponding thereto) and do not define the specific voltage value of the high level or the specific voltage value of the low level. Moreover, the terms do not define that high levels applied to different signal lines in the present specific embodiment are all equal, for example, the high level of the bit line and the high level of the word line may be different voltages. The terms do not define that high levels of a particular signal line in different phases are equal, for example, the high levels applied by the bit line when writing "1" and during the read operation may be different voltage values. Those skilled in the art should understand that the values of the corresponding high and low levels can be set according to process nodes, speed requirements, reliability requirements, and the like.

An embodiment of the present invention further provides a storage array. The storage array includes the storage cell provided in the embodiment of the present invention, and tunnel junctions of the storage cells are arranged in an array. The first direction is a column direction of the tunnel junctions of the storage cells, and the second direction is a row direction of the tunnel junctions of the storage cells. Since the storage array provided in the embodiment of the present invention includes the storage cell provided in the embodiment of the present invention, higher integration can be provided and the comprehensive performance of the storage array can be improved under the condition of guaranteeing the writing or programming capability.

Figure 7:
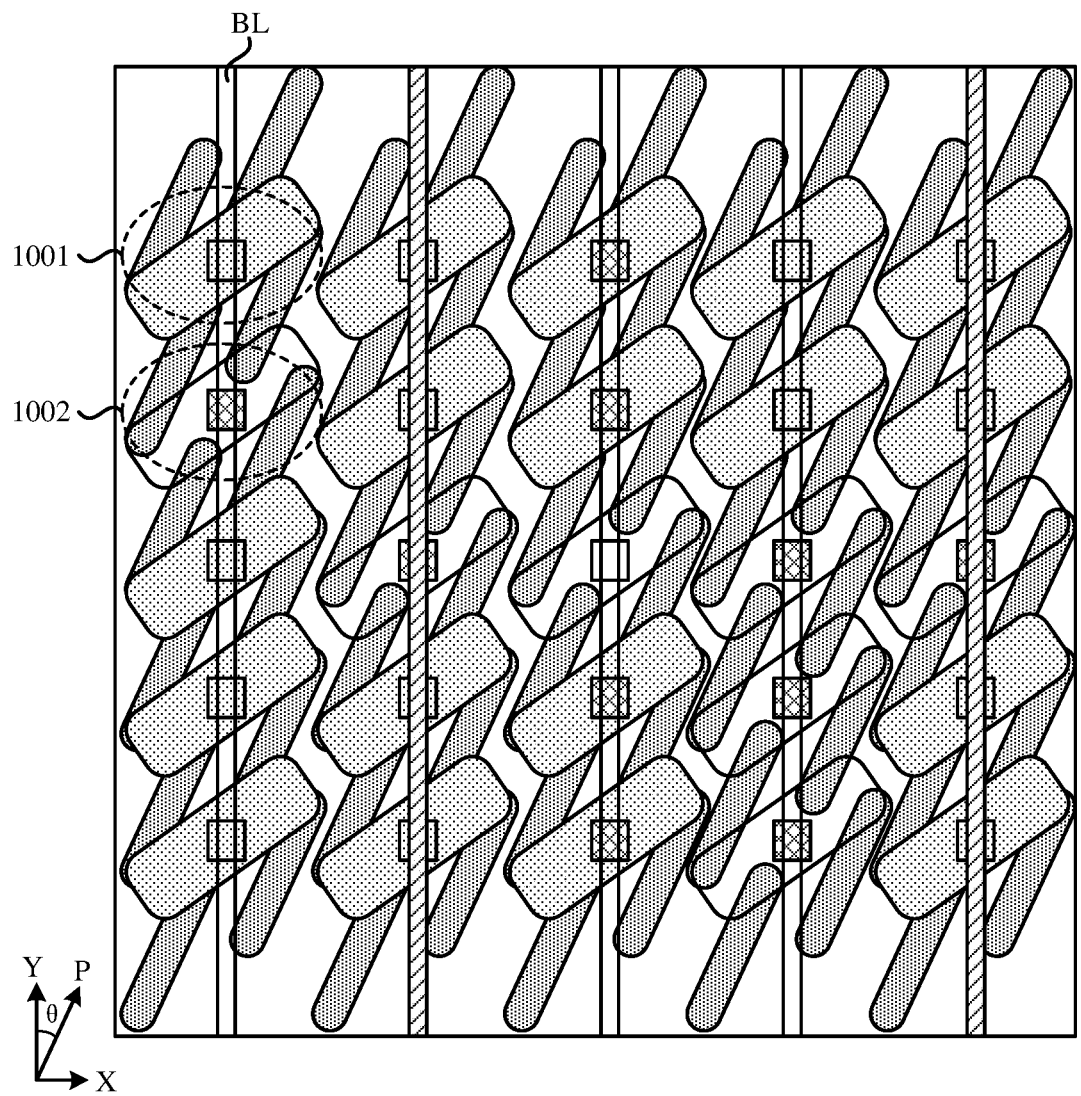
FIG. 7 is a schematic structural diagram of a storage array according to an embodiment of the present invention.

Optionally, FIG. 7 is a schematic structural diagram of a storage array according to an embodiment of the present invention. As shown in FIG. 7, when the four access transistors of each storage cell are a first access transistor, a second access transistor, a third access transistor, and a fourth access transistor respectively, in two storage cells that are in different rows and adjacent to each other, the storage cell in a preceding row is a storage cell 1001 in the row, and the storage cell in a succeeding row is a storage cell 1002 in the $(i+1)^{th}$ row. The active region of the fourth access transistor of the storage cell 1001 in the row and the active region of the first access transistor of the storage cell 1002 in the $(i+1)^{th}$ row are an integrated structure; and the active region of the second access transistor of the storage cell 1001 in the $i^{th}$ row and the active region of the third access transistor of the storage cell 1002 in the $(i+1)^{th}$ row are an integrated structure. In this way, the action regions of the access transistors in two storage cells that are in different rows and adjacent to each other are set to an integrated structure to further save the space occupied by the storage cells, so as to further improve the integration of the storage array.

Optionally, each storage cell includes at least one word line, at least one source line, and a bit line; the storage cells in the same row share the word line and the source line; and the storage cells in the same column share the bit line.

Figure 8:
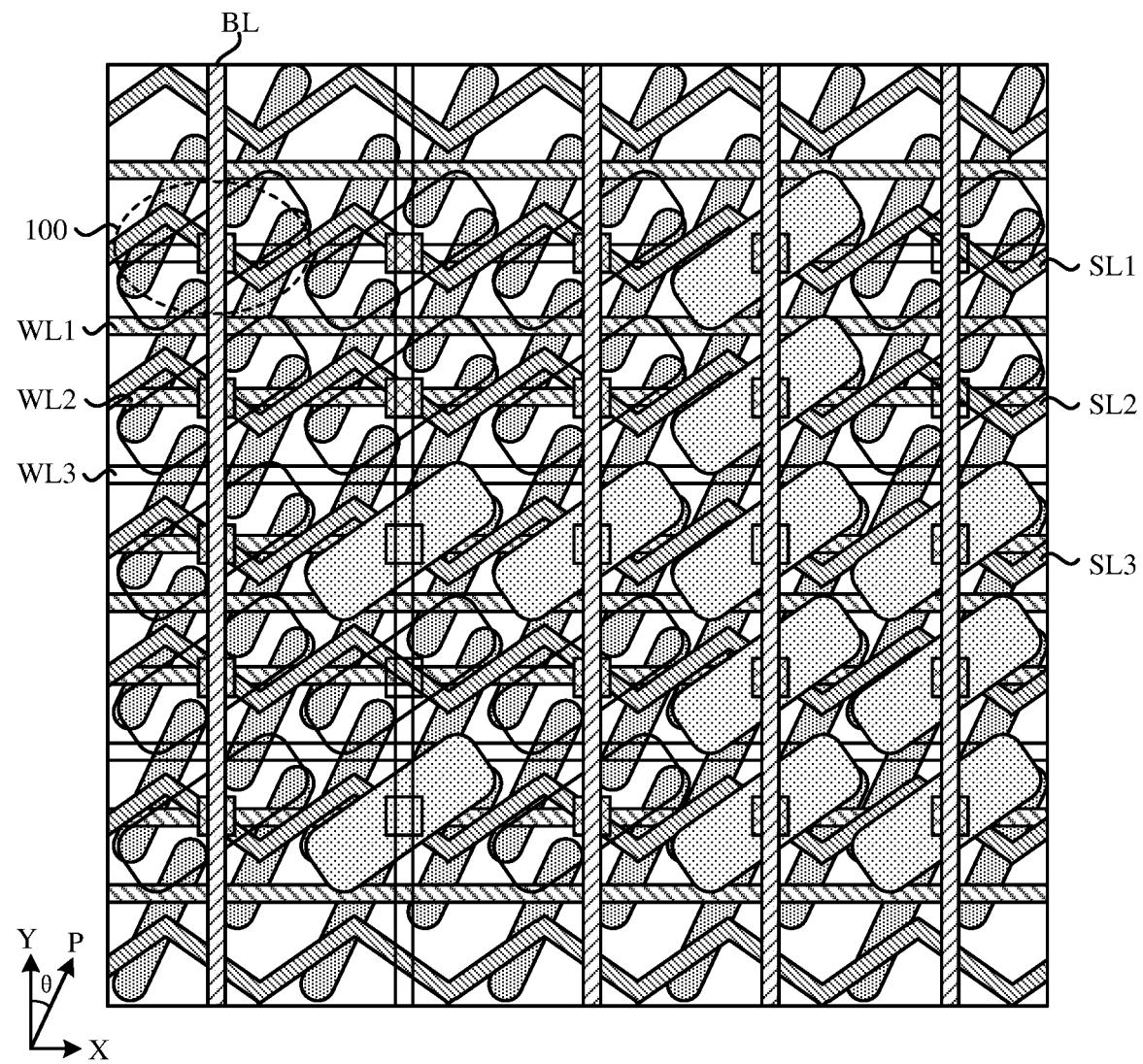
FIG. 8 is a schematic structural diagram of another storage array according to an embodiment of the present invention.

Illustratively, FIG. 8 is a schematic structural diagram of another storage array according to an embodiment of the present invention. As shown in FIG. 8, when the four access transistors of each storage cell are a first access transistor, a second access transistor, a third access transistor, and a fourth access transistor respectively, each storage cell 100 may include three word lines, three source lines, and one bit line. The three word lines are a first word line WL1, a second word line WL2, and a third word line WL3 respectively. The three source lines are a first source line SL1, a second source line SL2, and a third source line SL3 respectively. The word lines (WL1, WL2, WL3) are all straight lines extending along the second direction x, and the word lines (WL1, WL2, WL3) are arranged along the first direction Y. The source lines (SL1, SL2, SL3) are all folding lines, and the source lines (SL1, SL2, SL3) are arranged along the first direction Y. The first access transistors and the third access transistors of the storage cells 100 in the same row share the first word line WL1, so that a gate control signal transmitted by the first word line WL1 can control the sources and the drains of the first access transistors and the third access transistors of the storage cells in the same row to switch on. The first access transistors and the second access transistors of the storage cells 100 in the same row share the second word line WL2, so that a gate control signal transmitted by the second word line WL2 can control the sources and the drains of the first access transistors and the second access transistors of the storage cells in the same row to switch on. The fourth access transistors and the second access transistors of the storage cells 100 in the same row share the third word line WL3, so that a gate control signal transmitted by the third word line WL3 can control the sources and the drains of the fourth access transistors and the second access transistors of the storage cells in the same row to switch on.

The third access transistors of the storage cells 100 in the same row share the first source line SL1, so that the drains of the third access transistors of the storage cells 100 in the same row can receive a data signal transmitted by the same first source line SL1, or can read data signals stored in the storage cells 100 in the same row through the same first source line SL1. The first access transistors and the second access transistors of the storage cells 100 in the same row share the second source line SL2, so that the drains of the first access transistors and the second access transistors of the storage cells 100 in the same row can receive a data signal transmitted by the same second source line SL2, or can read data signals stored in the storage cells 100 in the same row through the same second source line SL2. The fourth access transistors of the storage cells 100 in the same row share the third source line SL3, so that the drains of the fourth access transistors of the storage cells 100 in the same row can receive a data signal transmitted by the same third source line SL3, or can read data signals stored in the storage cells 100 in the same row through the same third source line SL3.

In addition, the storage cells 100 in the same column share the bit line BL, so that the second ends of the tunnel junctions of the storage cells in the same column can receive a read/write signal transmitted by the same bit line BL, and corresponding data signals can be written to the corresponding storage cells 100, or data signals stored in the corresponding storage cells 100 can be read.

In this way, the storage cells in the same row can share a word line and a source line, and the storage cells in the same column can share a bit line. A row where a storage cell is located can be controlled and positioned through a gate control signal transmitted by the word line, and a column where a storage cell is located can be positioned through the bit line, so that data signals can be written into the storage cells in a one-to-one corresponding manner, or data signals stored in the storage cells can be read in a one-to-one corresponding manner. At the same time, when the storage cells in the same row can share a word line and a source line and the storage cells in the same column can share a bit line, the integration of the storage array can be further improved.

It should be appreciated that the above are merely preferred embodiments of the present invention and the technical principles applied therein. Those skilled in the art should understand that the present invention is not limited to the specific embodiments described herein, and those skilled in the art can make obvious changes, re-adjustments, re-combinations, and replacements without departing from the protection scope of the present invention. Therefore, although the present invention is described in detail through these embodiments, the present invention is not limited to merely the above embodiments, and may further include more other equivalent embodiments without departing from the concept of the present invention, and the scope of the present invention is defined by the scope of the appended claims.

What is claimed is:

1. A storage cell, comprising: a bit line, a tunnel junction, and four access transistors;
    sources of the access transistors being all electrically connected to a first end of the same tunnel junction; a second end of the tunnel junction being all electrically connected to the bit line; and the bit line extending along a first direction; and
    active regions corresponding to the access transistors being isolated from each other; long-side extension directions of the active regions corresponding to the access transistors being the same, and a first angle θ being formed between the long-side extension directions of the active regions and the first direction; wherein θ is a non-right angle; and,
    wherein the four access transistors comprise a first access transistor, a second access transistor, a third access transistor, and a fourth access transistor; a long side of an active region of the first access transistor is disposed opposite to a long side of an active region of the second access transistor, and an active region of the third access transistor and an active region of the fourth access transistor are located between the active region of the first access transistor and the active region of the second access transistor; and a short side of the active region of the third access transistor is disposed opposite in a direction along the extension direction of the active regions to a short side of the active region of the fourth access transistor.

2. The storage cell according to claim 1, wherein the four access transistors comprise a first access transistor, a second access transistor, a third access transistor, and a fourth access transistor; and
    an orthographic projection of the tunnel junction in a film layer where the active region of each access transistor is located covers at least a partial region between the active region of the first access transistor and the active region of the second access transistor, and covers at least a partial region between the active region of the third access transistor and the active region of the fourth access transistor.

3. The storage cell according to claim 1, further comprising: at least one word line and at least one source line; the word line extending along a second direction; wherein the first direction intersects with the second direction;
    each access transistor further comprises a channel region and a drain, and the source and the drain are located on two opposite sides of the channel region respectively;
    gates of the access transistors are electrically connected to the word line; and
    the drains of the access transistors are electrically connected to the source line.

4. The storage cell according to claim 3, wherein the at least one word line comprises a first word line, a second word line, and a third word line that are sequentially arranged along the first direction;
    the four access transistors comprise a first access transistor, a second access transistor, a third access transistor, and a fourth access transistor;
    the gate of the third access transistor is electrically connected to the first word line;
    the gate of the first access transistor and the gate of the second access transistor are both electrically connected to the second word line; and
    the gate of the fourth access transistor is electrically connected to the third word line.

5. The storage cell according to claim 4, wherein
    an orthographic projection of the first word line in the active region of each access transistor overlaps with the active region of the first access transistor and the active region of the third access transistor;
    an orthographic projection of the second word line in the active region of each access transistor overlaps with the active region of the first access transistor and the active region of the second access transistor; and
    an orthographic projection of the third word line in the active region of each access transistor overlaps with the active region of the fourth access transistor and the active region of the second access transistor.

6. The storage cell according to claim 4, wherein the at least one source line comprises a first source line, a second source line, and a third source line that are sequentially arranged along the first direction and extend in the same direction;
    the drain of the third access transistor is electrically connected to the first source line;
    the drain of the first access transistor and the drain of the second access transistor are both electrically connected to the second source line; and the drain of the fourth access transistor is electrically connected to the third source line.

7. The storage cell according to claim 6, wherein
an orthographic projection of the first source line in the active region of each access transistor overlaps with the drain of the third access transistor;
an orthographic projection of the second source line in the active region of each access transistor overlaps with both the drain of the first access transistor and the drain of the second access transistor; and an orthographic projection of the second source line in a film layer where the active region of each access transistor is located further overlaps with an orthographic projection of the tunnel junction in the film layer where the active region of each access transistor is located; and
an orthographic projection of the third source line in the active region of each access transistor overlaps with the drain of the fourth access transistor.

8. The storage cell according to claim 1, further comprising: a connection structure;
an orthographic projection of the connection structure in the active region of each access transistor overlapping with the active regions of the four access transistors; and
the sources of the access transistors being all electrically connected to the first end of the tunnel junction through the connection structure.

9. The storage cell according to claim 8, further comprising: at least one word line; the bit line and the word line being straight lines, and the word line extending along a second direction; wherein the first direction is perpendicular to the second direction.

10. The storage cell according to claim 9, comprising:
a substrate comprising the active regions of the access transistors and an isolation structure located between two adjacent active regions, and the active regions of the access transistors each being provided with a trench;
part of the word line being located in the trenches of the active regions;
a source line being located on one side of the word line away from the substrate;
the connection structure being located on one side of the source line away from the substrate;
the tunnel junction being located on one side of the connection structure away from the substrate; and
the bit line being located on one side of the tunnel junction away from the substrate.

11. The storage cell according to claim 1, wherein channel doping types of the four access transistors are the same.

12. A data read/write method applied to the storage cell according to claim 1, wherein each access transistor of the storage cell further comprises a drain and a channel region, and the source and the drain are located on two opposite sides of the channel region respectively; and each access transistor further comprises a gate;
the data read/write method comprises a data write phase;
the second end of the tunnel junction receives a high-level signal transmitted by the bit line, the drain of the access transistor receives a low-level signal, and the gate of each access transistor receives a gate control signal to control the source and the drain of each access transistor to connect to perform a first write operation;
and/or the second end of the tunnel junction receives a low-level signal transmitted by the bit line, the drain of the access transistor receives a high-level signal, and the gate of each access transistor receives a gate control signal to control the source and the drain of each access transistor to connect, to perform a second write operation.

13. The data read/write method according to claim 12, wherein the data read/write method further comprises a data read phase; and
the second end of the tunnel junction receives a high-level signal transmitted by the bit line, the drain of the access transistor receives a low-level signal, and the gate of each access transistor receives a gate control signal to control the source and the drain of each access transistor to connect, to perform a read operation.

14. A storage array, comprising: a plurality of storage cells according to claim 1; tunnel junctions of the storage cells being arranged in an array;
wherein a first direction is a column direction of the tunnel junctions of the storage cells, and a second direction is a row direction of the tunnel junctions of the storage cells.

15. The storage array according to claim 14, wherein when the four access transistors of each storage cell are a first access transistor, a second access transistor, a third access transistor, and a fourth access transistor respectively, in two storage cells that are in different rows and adjacent to each other, the storage cell in a preceding row is a storage cell in an $i^{th}$ row, and the storage cell in a succeeding row is a storage cell in an $(i+1)^{th}$ row; and
the active region of the fourth access transistor of the storage cell in the $i^{th}$ row and the active region of the first access transistor of the storage cell in the $(i+1)^{th}$ row are an integrated structure; and the active region of the second access transistor of the storage cell in the $i^{th}$ row and the active region of the third access transistor of the storage cell in the $(i+1)^{th}$ row are an integrated structure.

16. The storage array according to claim 14, wherein each storage cell comprises at least one word line, at least one source line, and a bit line; and
the storage cells in the same row share the word line and the source line; and the storage cells in the same column share the bit line.

17. The storage array according to claim 16, wherein when the four access transistors of each storage cell are a first access transistor, a second access transistor, a third access transistor, and a fourth access transistor respectively, the at least one word line of each storage cell comprises a first word line, a second word line, and a third word line; the word lines are straight lines extending along the second direction, and the word lines are arranged along the first direction;
the first access transistors and the third access transistors of the storage cells in the same row share the first word line;
the first access transistors and the second access transistors of the storage cells in the same row share the second word line; and
the fourth access transistors and the second access transistors of the storage cells in the same row share the third word line.

18. The storage array according to claim 16, wherein when the four access transistors of each storage cell are a first access transistor, a second access transistor, a third access transistor, and a fourth access transistor respectively, the at least one source line of each storage cell comprises a first source line, a second source line, and a third source line; the source lines are folding lines, and the source lines are arranged along the first direction;

the third access transistors of the storage cells in the same row share the first source line;
the first access transistors and the second access transistors of the storage cells in the same row share the second source line; and
the fourth access transistors of the storage cells in the same row share the third source line.

* * * * *